(12) United States Patent
Takida

(10) Patent No.: US 9,143,095 B2
(45) Date of Patent: Sep. 22, 2015

(54) DC-DC CONVERTER AND AUDIO OUTPUT UNIT

(75) Inventor: Takayuki Takida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 13/605,935

(22) Filed: Sep. 6, 2012

(65) Prior Publication Data

US 2013/0223650 A1 Aug. 29, 2013

(30) Foreign Application Priority Data

Feb. 29, 2012 (JP) ................................ P2012-044050

(51) Int. Cl.
  *H03F 99/00* (2009.01)
  *G05F 3/04* (2006.01)
  *G05F 3/08* (2006.01)
  *H03F 3/181* (2006.01)
  *H02M 3/07* (2006.01)

(52) U.S. Cl.
  CPC  *H03F 3/181* (2013.01); *H02M 3/07* (2013.01)

(58) Field of Classification Search
  None
  See application file for complete search history.

(56) References Cited

U.S. PATENT DOCUMENTS

| 2005/0088158 A1* | 4/2005 | Horiguchi et al. | 323/282 |
|---|---|---|---|
| 2009/0027022 A1 | 1/2009 | Oyama | |
| 2009/0066408 A1 | 3/2009 | Fujiwara | |

FOREIGN PATENT DOCUMENTS

| JP | 2002-272091 | 9/2002 |
|---|---|---|
| JP | 2009-017668 A | 1/2009 |
| JP | 2010-283952 A | 12/2010 |
| JP | 2011-147161 A | 7/2011 |

OTHER PUBLICATIONS

Japanese Office Action, Patent Application No. 2012-044050, dated Jun. 6, 2014.

* cited by examiner

*Primary Examiner* — Regina N Holder
(74) *Attorney, Agent, or Firm* — Patterson & Sheridan, LLP

(57) ABSTRACT

A DC-DC converter includes a first capacitor which can be charged by a power-supply voltage; a second capacitor that generates the output voltage using electric charge previously discharged by the first capacitor; a comparator that compares the output voltage with a reference voltage and outputs a comparison signal that shows whether the output voltage is below the reference voltage; multiple switches that switch to allow the first capacitor either to be charged or to discharge its charge to the second capacitor, and a controller that controls the switch timing of the multiple switches on the basis of the comparison signal.

17 Claims, 12 Drawing Sheets

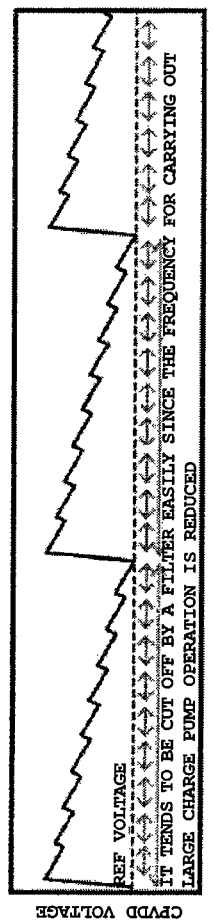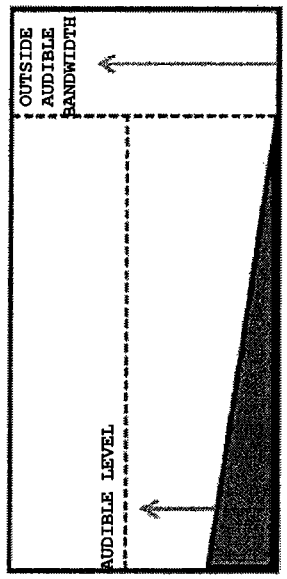
Fig. 10A
Fig. 10B

US 9,143,095 B2

DC-DC CONVERTER AND AUDIO OUTPUT UNIT

CROSS-REFERENCE TO RELATED APPLICATION

This application is based upon and claims the benefit of priority from Japanese Patent Application No. 2012-044050, filed Feb. 29, 2012; the entire contents of which are incorporated herein by reference.

FIELD

Embodiments described herein relate to a charge pump type of DC-DC converter and an audio output unit built-in with this DC-DC converter.

BACKGROUND

It is common that new mobile phones and smart phones have the function of playback of digital audio data, and a headphone is often connected to listen to the sound. In the case of playback of audio sound through a headphone, an earphone speaker, LINE output, or other channels, the charge pump type of DC-DC converter is used in the power supply circuit for the audio output unit, since the output wattage of the audio signal also can be small. Since an inductor for an external part is not required when a charge pump type of DC-DC converter is used, the charge pump type is suitable for small electronic devices for audio playback with a headphone or other means.

However, when the charge pump type of DC-DC converter is used, the spurious element of the constant frequency is contained in the output ripple voltage when the load current is constant, since that intermittent operation is executed for increasing the voltage only when the output voltage falls below the reference voltage.

The spurious element is generated in the audible bandwidth and affects digital-to-analog converter (DAC) output and the output amplifier that utilizes the DC-DC converter as a power supply, depending on the load current and the drive capability of the DC-DC converter. At this time, if the power supply rejection ratio (PSRR) of the circuits such as DAC and the output amplifiers is insufficient, the spurious element of the audible bandwidth mixes with the output as provided by the output amplifier, the undesirable noise becomes audible, and the S/N ratio also deteriorates. In particular, single frequency sound is present in the output of the output amplifier in the form of noise when there is no signal, which might cause unpleasantness for the listener.

In order to reduce the spurious noise element, constraining the current by increasing ON resistance of the switching MOS for switching the connection of the flying capacitor and the decoupling capacitor within the charge pump type of DC-DC converter has been considered. When increasing ON resistance of the MOS for switching, the loss caused by heat would increase, and the voltage conversion efficiency would decrease.

DESCRIPTION OF THE DRAWINGS

FIGS. 10A and 10B are diagrams showing the characteristics of the DC-DC converter shown in FIG. 9.

DETAILED DESCRIPTION

According to the embodiment, there is provided a DC-DC converter and an audio output unit configured such that the spurious element caused by the ripple of the output voltage is not audible and no decrease of the voltage conversion efficiency occurs.

This embodiment provides a DC-DC converter characterized by a first capacitor which is can be charged in response to the power-supply voltage; a second capacitor that generates the output voltage by using the electric charge of the first capacitor; a comparator that compares the output voltage with a reference voltage and outputs a comparison signal that shows whether the output voltage is below the reference voltage; a switch that switches to allow the first capacitor either to be charged or to discharge its electric charge to the second capacitor, and a controller that controls the switch timing of the switch on the basis of the comparison signal.

An embodiment will be described below with reference to the drawings.

Embodiment 1

Figure 1:
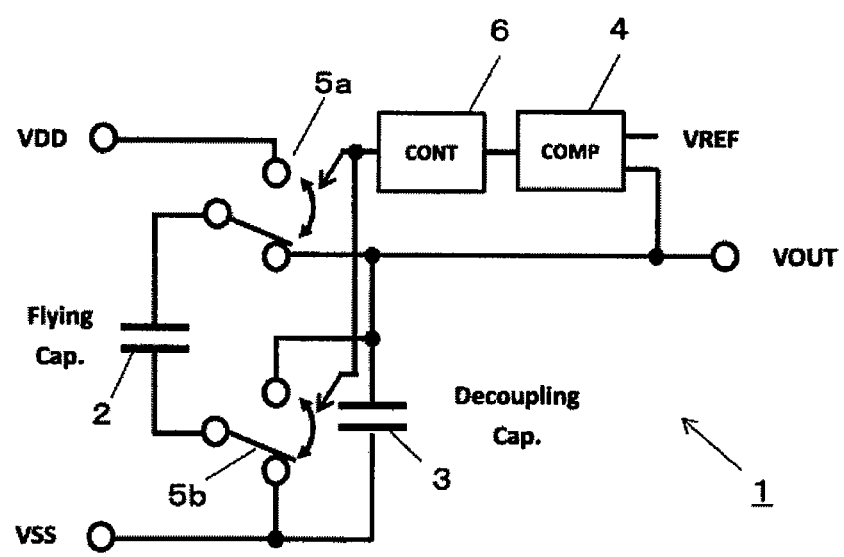
FIG. 1 is a diagram showing the schematic configuration of a DC-DC converter according to a first embodiment.

FIG. 1 is a diagram showing the schematic configuration of a DC-DC converter 1 according to the first embodiment. The DC-DC converter 1 of FIG. 1 may be used in the power supply circuit of an audio output unit, as an example.

The DC-DC converter 1 in FIG. 1 is a so-called charge pump type, and is equipped with a flying capacitor 2, a decoupling capacitor 3, a comparator (COMP) 4, switches 5a and 5b, and a controller (CONT) 6. In particular, it provides a controller 6.

One terminal of the flying capacitor 2 is connected with the switch 5a, and the other terminal is connected with the switch 5b. The flying capacitor 2 is charged based on the power supply voltage and its resulting electric charge is discharged by controlling the switching of switches 5a and 5b.

One terminal of the decoupling capacitor 3 is connected with the output terminal, and the other terminal is grounded. The decoupling capacitor 3 is charged based on the electric charge discharged from the flying capacitor 2 and its resulting electric charge is discharged by controlling the switching of switches 5a and 5b. The potential difference between the terminals of the decoupling capacitor 3 is the output voltage VOUT.

The comparator 4 compares the output voltage VOUT with the reference voltage VREF, and outputs a comparison signal that is based on whether the output voltage is less than or greater than the reference voltage. The comparator 4, according to this embodiment, increases the comparison signal to a high level if the output voltage falls below the reference voltage, and reduces the comparison signal to a low level if the output voltage is above the reference voltage.

Switches 5a and 5b switch to allow the flying capacitor 2 to charge or to discharge its electric charge to the decoupling capacitor 3. The switches 5a and 5b are operated on the basis of the comparison signal output from comparator 4.

The controller 6 generates control signals for controlling the switch timing of the switches 5a and 5b on the basis of the comparison signals output from the comparator 4. In particular, the controller 6 generates the control signal for controlling the switch timing of the switches 5a and 5b so that the cycles for charging the flying capacitor 2 are randomized. By operating the controller 6 in this manner, the amplitude and the cycle of the ripple of the output voltage are randomized, noise power associated with the spurious element is distributed throughout the frequency spectrum, and the amplitude of the spurious element is reduced.

Figure 2C:
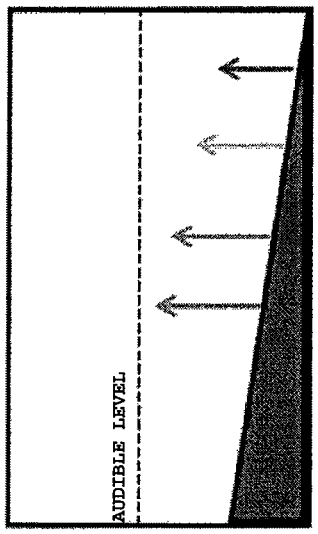
FIGS. 2A to 2D are diagrams showing the characteristics of the DC-DC converter according to the first embodiment.
Figure 2D:
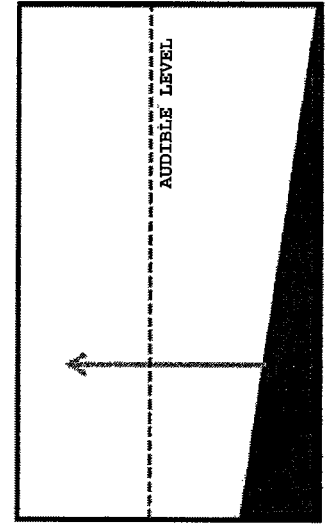
Figure 2A:
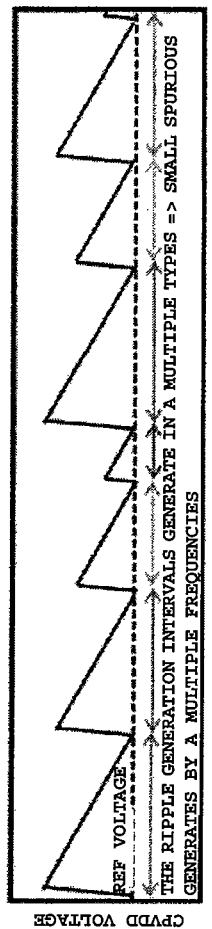
Figure 2B:
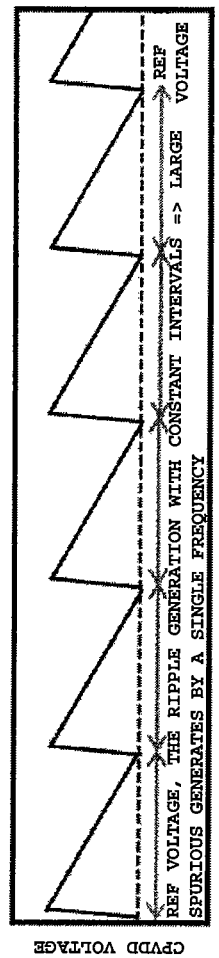

FIGS. 2A to 2D are figures showing the characteristics of the DC-DC converter 1 according to this embodiment. FIG. 2A is a waveform chart of the output voltage of the DC-DC converter 1. As shown in this figure, the cycle and the amplitude of the output voltage ripple is randomized according to this embodiment. Therefore, when the Fourier transform (FFT) of the output voltage waveform is produced, as shown in FIG. 2B, the spurious element is decentralized in the frequency spectrum, and the power of each spurious element is reduced to a point such that it would not exceed the audibility level.

For purposes of comparison, in DC-DC converters in which there is no controller 6, the periodicity and the amplitude of the output voltage ripple are approximately constant, as shown in FIG. 2C. Therefore, if the Fourier transform is computed for the output voltage waveform in FIG. 2C, a large spurious element that exceeds the audibility level would appear at one frequency as shown in FIG. 2D. This amount of power at one frequency will cause the generation of undesirable noise and deterioration in the S/N ratio at the signal that is output from the audio output unit.

In this embodiment, the controller 6 randomizes the switching time of switches 5a and 5b, so that the results as shown in FIG. 2A and FIG. 2B can be obtained. The methods for the controller 6 to randomize the switch timing of the switches 5a and 5b are included the following, for example.

1) The switch timing of the switches 5a and 5b is set randomly by using the measurement value of a counter.

2) The switch timing of the switches 5a and 5b is set randomly by using a (pseudo) random number generated by a random number generating circuit.

3) During a cycle of switching the switches 5a and 5b, a dead time during which no charge is delivered to the flying capacitor 2 and the decoupling capacitor 3 occurs. The time length of this dead time is adjusted at random, and the switch timing of the switches 5a and 5b can be randomized as a result.

4) The switch timing for the switches 5a and 5b can be randomized by using the output of a $\Delta\Sigma$ modulator. The modulator is part of a $\Delta\Sigma$ digital-to-analog (D/A) converter installed in the audio output unit which is built in to the DC-DC converter 1 of FIG. 1. Moreover, it is also acceptable to use signals randomized by a scrambler, which is generally used in a $\Delta\Sigma$ digital-to-analog converter.

5) The switch timing of the switches 5a and 5b can be randomized by using the output of a $\Delta\Sigma$ analog-to-digital (A/D) converter which is installed in the sound input system of the DC-DC converter 1 of FIG. 1.

6) The frequency band where the spurious element is located can be shifted to a higher frequency part of the spectrum by switching the ON resistance of a transistor incorporated into switch 5—the switch that activates charging of the flying capacitor 2.

The detailed configurations for realization of the methods 1-6 will be described in the embodiments below. It is acceptable to adopt either one of the methods 1-6 or to randomly combine any two or more of the methods.

When using the first embodiment, the control signal is generated in the controller 6 based on the comparison signals output from the comparator 4 of the charge pump DC-DC converter 1. Since the switch timing of the switches 5a and 5b is randomly adjusted by using this control signal, the level of the spurious element that appears in the output voltage is reduced, and the S/N ratio is improved also.

Embodiment 2

The second embodiment described below specifies an internal configuration of the switches 5a and 5b described by the first embodiment.

Figure 3:
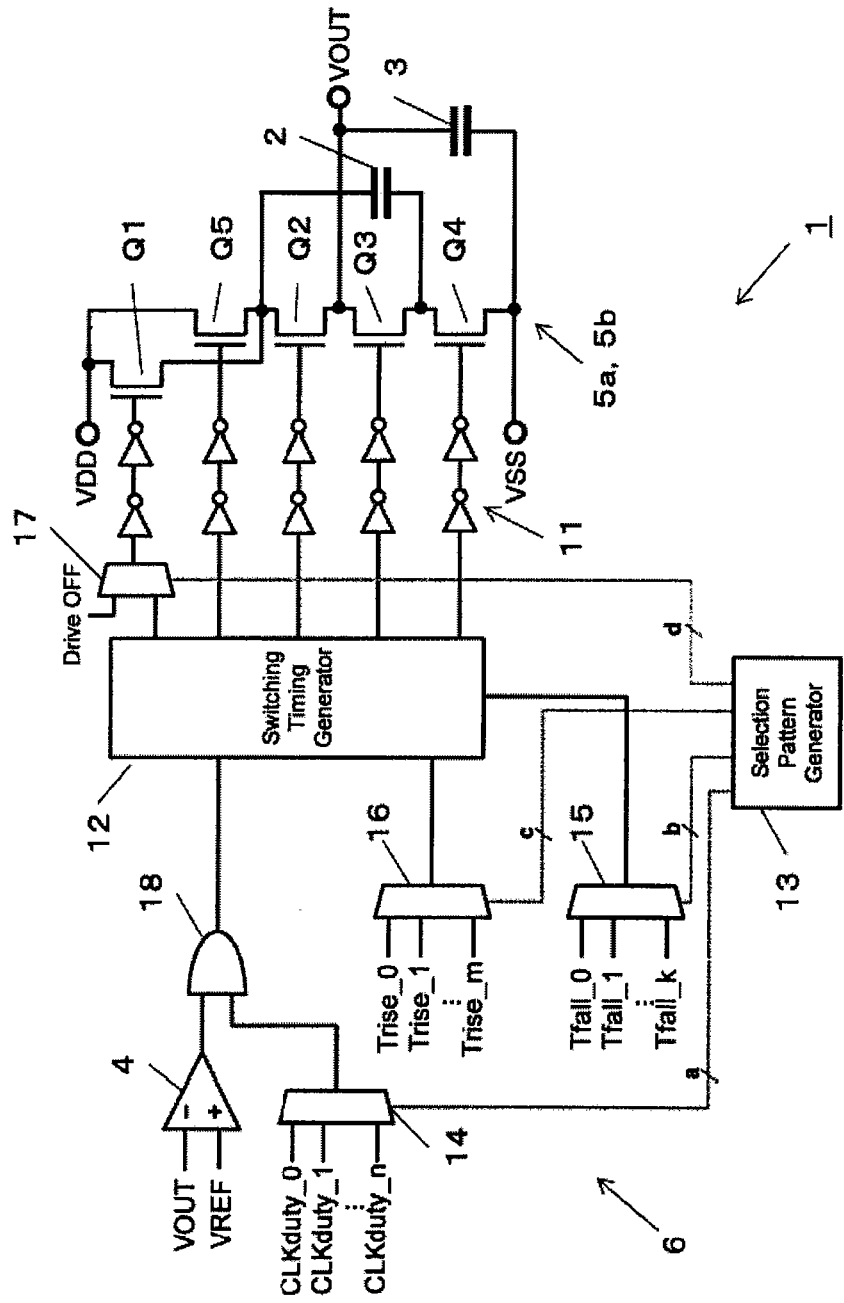
FIG. 3 is a block diagram showing a schematic configuration of a DC-DC converter according to a second embodiment.

FIG. 3 is a block diagram showing the schematic configuration of the DC-DC converter 1 according to the second embodiment. Just as in FIG. 1, the DC-DC converter 1 of FIG. 3 includes a flying capacitor 2, a decoupling capacitor 3, a comparator 4, switches 5a, 5b, and a controller 6.

The switches 5a and 5b together include four dependently connected transistors Q1-Q4 between the power supply terminal VDD and the ground terminal VSS, a transistor Q5 connected in parallel with the transistor Q1, and an inverter group 11 which comprises inverters, each of which is connected to the gate of one of the transistors Q1-Q5.

The controller 6 includes a switch timing generator that controls the ON/OFF state of the transistor Q1-Q5, a selection pattern generator 13, first through fourth multiplexers 14-17 that switch the selection operation in accordance with the output signal of the selection pattern generator 13, and an AND circuit 18.

The output signal of the selection pattern generator 13 has multiple bits in which the first bit string 'a', which is a portion of the multiple bits, is used as the selection instruction for the first multiplexer 14. The second bit string 'b', which is another portion, is used as the selection instruction for the second multiplexer 15, the third bit string 'c', which is a further portion, is used as the selection instruction for the third multiplexer 16, and the remaining fourth bit string 'd' is used as the selection instruction for the fourth multiplexer 17.

A counter or a random number generating circuit (not shown) is provided in the selection pattern generator 13, and the output signal of the selection pattern generator is generated on the basis of the count value of the counter or the random numbers generated by the random number generating circuit. As a result, the output signal of the selection pattern generator 13 is a random bit string. Incidentally, although the output signal of the selection pattern generator 13 generated by the count value of the counter is not a random bit string strictly, this output signal is a cyclical bit string having long-periodicity. Therefore, since periodicity becomes weaker when there are many bits counted in the counter, the spurious element that appears in the output voltage can be suppressed below the audibility level.

If the multiplexers are configured so as to select one of only two target signals, since this selection operation can be executed only by one bit, the first through the fourth bit strings a, b, c, and d may be as short as one bit in length.

On the basis of the first bit string a, the first multiplexer 14 selects one signal out of four types of clock signals of different duty ratios. The clock signal selected by the first multiplexer 14 passes through the AND circuit 18, and is input to the switch timing generator 12 only when the output signal of the comparator is high. In order for the output signal of the comparator 4 to be high, the output voltage first falls below the reference voltage. In this case, the clock signal having the duty ratio selected by the first multiplexer 14 will be input to the switch timing generator 12.

On the basis of the second bit string b, the second multiplexer 15 selects one signal from multiple clock signals which have unique fall timing. The output signal of the second multiplexer 15 is input to the switch timing generator 12. The switch timing generator 12 sets the fall time of the input clock signal that is selected by the first multiplexer 14, according to the selection result of the second multiplexer 15.

On the basis of the third bit string c, the third multiplexer 16 selects one signal from multiple clock signals having unique rise times. The output signal of the third multiplexer 16 is input to the switch timing generator 12. The switch timing generator 12 sets the rise time of the clock signal that is selected by the first multiplexer 14, according to the selection result of the third multiplexer 16.

On the basis of the fourth bit string d, the fourth multiplexer 17 is used to decide gate logic of the transistor Q1, and selects either the drive-off signal that forcefully turns off the transistor Q1 or the output signal of the switch timing generator 12.

In FIG. 3, controlling of the transistor Q1 is done only in two stages of operative/inoperative, but it can be divided into three or more instead of into only two of the transistors Q1 and Q5, and it is acceptable to control multiple stages by arbitrarily switching to operative/inoperative of three or more transistors.

It is not required that all of the first through the fourth multiplexers 14-17 are installed in the controller 6. It is acceptable for only any one of them to be installed, or any combination of from one to four multiplexers of these first through fourth multiplexers 14-17 can be installed.

The switch timing generator 12 controls the ON/OFF state of the transistor Q1-Q5 by using the clock signal generated based on the output signal of the first through the third multiplexers 14-16.

For instance, when charging the flying capacitor 2, transistor Q1 or both transistors Q1 and Q5 are turned ON, and the transistor Q3 is turned ON, while the transistor Q4 is turned OFF. The reason for parallelizing the transistors Q1 and Q5 is to switch the ON-resistance of the switch. If both the transistors Q1 and Q5 are turned ON, ON-resistance of the switch can be reduced below the resistance in the case in which only transistor Q1 is turned ON. By reducing the ON-resistance, the amount of charge per unit time for charging the flying capacitor 2 can be made variable. If controlling of the ON-resistance is not required, it is acceptable to not install transistor Q1.

On the other hand, when the flying capacitor 2 discharges its charge to the decoupling capacitor 3, transistors Q1, Q3, and Q5 are turned OFF, and the transistor Q2 and Q4 are turned ON.

When the switch timing generator 12 charges the flying capacitor 2, by using the clock signal generated on the basis of the output signal of the first through the third multiplexers 14-16 transistor Q1 or both transistors Q1 and Q5 are turned ON, and the timing for turning OFF the transistor Q2 is set. As described, as for the switch timing of the selection operation of the first through third multiplexers 14-16, since the selection pattern generator 13 is randomly set, the duty ratio, the rise time, and the fall time of the clock signal that are generated by the switch timing generator will be randomized also. Consequently, the ON/OFF timing of the transistors Q1-Q5 will be randomized, too.

As described, since, in accordance with this embodiment, at least one of the first-fourth multiplexers 14-17 is installed, the timing for the switch timing generator 12 to control the ON/OFF state of the transistors Q1-Q5 can be set on the basis of at least one of the duty ratio of the clock signal, the rising time of the clock signal, the falling time of the clock signal and the ON-resistance switching of the transistor Q1 or both transistor Q1 and Q5.

Thus, in the second embodiment, by using the random output signal generated with selection pattern generator 13, because at least one or more of the duty ratio of the clock signal, the rise time of the clock signal, the fall time of the clock signal, and the ON-resistance at the time of turning ON the flying capacitor 2 is alterable at random, the charge timing and the electrical discharge timing of the flying capacitor 2 can be randomly altered. As a result, the timing and the amplitude of the output ripple in the output signal of the DC-DC converter 1 will be random, and the level of the spurious element caused by the ripple in the output signal will decrease as a result. The generation of the undesirable noise can thereby be controlled, and the S/N ratio can also be improved.

Embodiment 3

In the third embodiment described below, there is randomization of the length of dead time during which charging does not take place in both the flying capacitor 2 and the decoupling capacitor 3.

In the DC-DC converter 1 of FIG. 3, when the flying capacitor 2 is charged, only transistor Q1 is turned on, or both transistors Q1 and Q5 are turned on. Also the transistor Q2 is turned off, Q3 is turned on, and the transistor Q4 is turned off. Moreover, when the decoupling capacitor 3 is charged, the transistors Q1, Q3, and Q5 are turned off, and the transistors Q2 and Q4 are both turned on.

In order to prevent flow-through current from flowing, it is effective to provide a dead time during which neither flying capacitor nor decoupling capacitor 3. This dead time can occur between the charge period of the flying capacitor 2 and the charge period of the decoupling capacitor 3. By randomly adjusting the length of dead time in this embodiment, the timing and the amplitude of the ripple in the output voltage is randomized.

Randomization of the length of the dead time can be realized by adjustment performed by the switch timing generator 12 of FIG. 3. The switch timing generator adjusts the timing that controls the gate potential of the transistors Q1-Q5.

Figure 4:
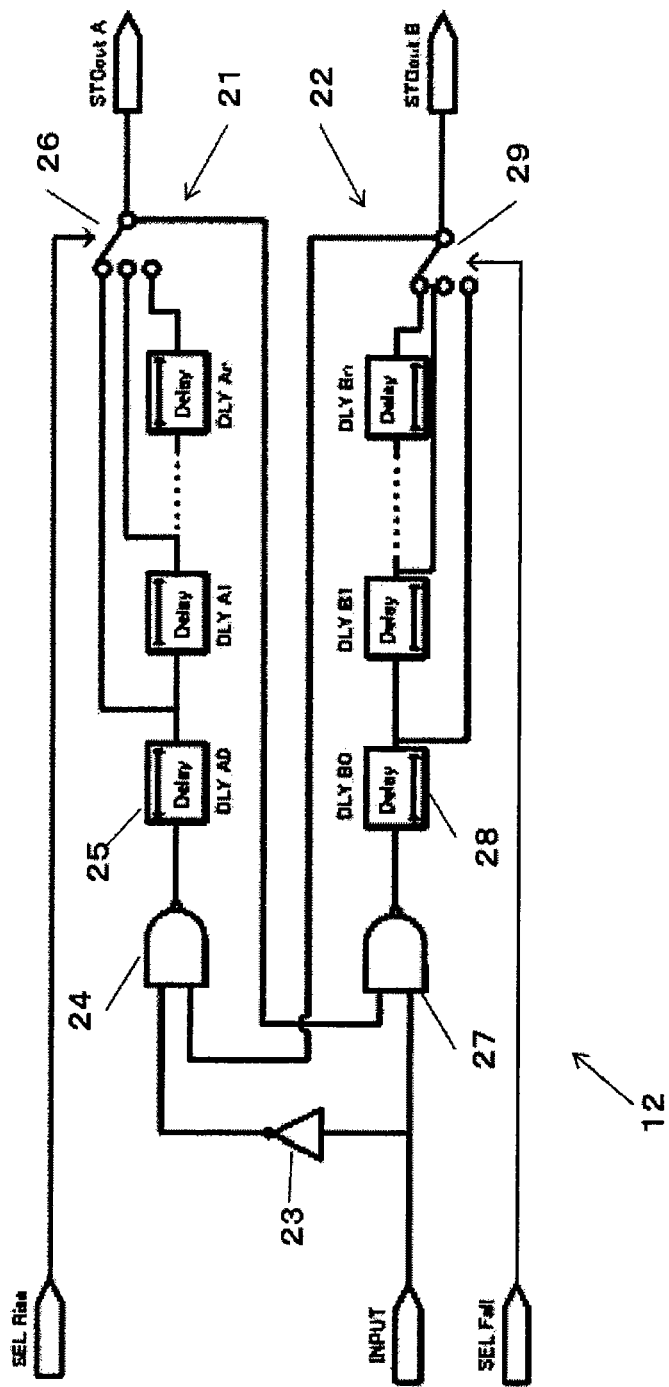
FIG. 4 is a block diagram showing an example of an internal configuration of a switching timing generator.

FIG. 4 is a block diagram showing an example of an internal configuration of the switching timing generator 12 according to the fourth embodiment. The output signal of AND circuit 18 in FIG. 3 is input to the switch timing generator 12 in FIG. 4 as an input signal.

The switch timing generator 12 in FIG. 4 contains a first gate controller 21 that controls the gate electrical potential for the transistors Q1 and Q5, and a second gate controller 22 that controls the gate electrical potential of the transistor Q2. The first gate controller 21 may also provide the gate control for the transistor Q3 depending on the operation mode, and the second gate controller 22 may also provide the gate control for the transistor Q4, depending on the operation mode.

The first gate controller 21 includes an inverter 23 that reverses the input signal, a NAND circuit 24 that performs a NAND operation where the NAND inputs are the output signal of the inverter 23 and the output signal of the second gate controller 22. The first gate controller also includes multiple stages of serially connected delay circuits 25 that sequentially delay the output signal of the NAND circuit 24, and a switch 26 used for selection of one signal from amongst the output signals of each delay circuit 25. The switcher 26 selects and outputs any one of the output signals of the delay circuit 25, on the basis of a bit string which is a part of the output signal output by the selection pattern generator 13 of FIG. 3 (for instance, the third bit string c).

The second gate controller 22 includes a NAND circuit 27 that performs a NAND operation in which the NAND inputs are the input signal (INPUT) and the output signal of the first gate controller 21. The second gate controller 22 also includes multiple stages of serially connected delay circuits 28 that sequentially delay the output signal of the NAND circuit 27, and a switch 29 that selects one signal from amongst the output signals of each delay circuit 28. The switcher 29 selects and outputs any one of the output signals of the delay circuit 28 on the basis of a bit string found in the output signal of the selection pattern generator 13 of FIG. 3 (for instance, the second bit string b).

Since the output signal of the selection pattern generator 13 is a random signaling bit string, both the first gate controller 21 and the second gate controller randomly select one of the output signals provide by delay circuits 25 or delay circuits 28, respectively. The first gate controller 21 randomly sets ON/OFF timing of the transistors Q1 and Q5, and the second gate controller 22 sets ON/OFF timing of the transistors Q2. In this way, the length of the dead time is randomized.

Figure 5:
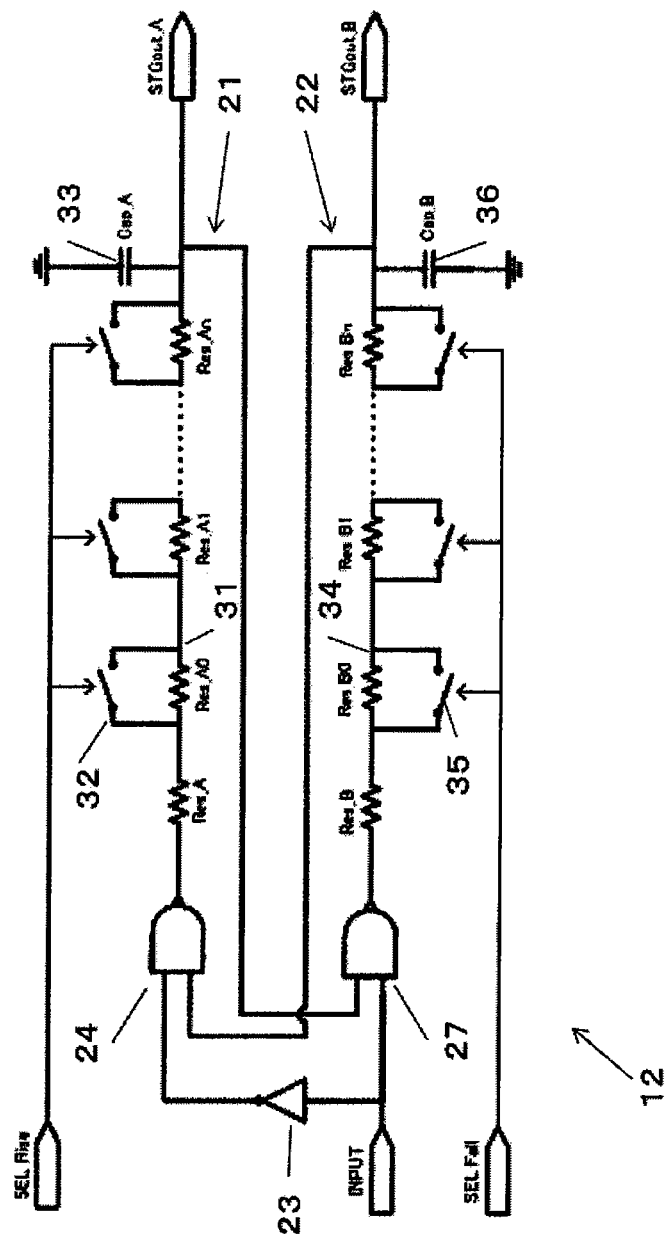
FIG. 5 is a block diagram showing an example of an internal configuration of the switching timing generator of FIG. 4.

FIG. 5 is a block diagram showing an example internal configuration of the switching timing generator 12, which is an embodiment of the configuration in FIG. 4. In FIG. 5, the series of delay circuits 25 (shown in FIG. 4) is configured using multiple resistors and a capacitor. The first gate controller 21 of FIG. 5 includes these multiple resistors 31 that are sequentially connected to the output signal terminal of the NAND circuit 24, switches 32 which are each connected in parallel with one of to the resistors 31, and a capacitor 33 installed between the output terminal and ground. The second gate controller 22 includes multiple resistive elements 34 that are sequentially connected to the output signal terminal of the NAND circuit 25, a plurality of switches 35 which are each connected to one of the resistive elements 34, and a capacitor 36 installed between the output terminal and ground.

The delay circuits 25 are not required to be formed using the RC structure of FIG. 5. For instance, the delay circuits 25 shown in FIG. 4 may be configured by an even number of stages in which each stage consists of an inverter such as the inverters 23.

Using these third embodiment techniques and configurations, the spurious element that exists in the output voltage can be reduced by adjusting the length of the dead time.

Embodiment 4

The second embodiment described the case of providing a counter or (pseudo) random number generating circuit within the selection pattern generator 13 which generates the output signal so that it has a random bit pattern. It is also acceptable to generate a random bit pattern with other circuits. For instance, it is known that the output signal of a $\Delta\Sigma$ modulator found within a $\Delta\Sigma$ D/A converter or the $\Delta\Sigma$ A/D converter often recently being used in audio equipment has a random bit pattern. The selection pattern generator 13 according to the fourth embodiment adjusts the switch timing of the switcher 5 using a random signal generated by a $\Delta\Sigma$ A/D converter or a $\Delta\Sigma$ modulator which modulates an $\Delta\Sigma$ D/A converter. Moreover, it is also acceptable to use the random signal of the scrambler output generally used for multi-bit $\Delta\Sigma$ D/A converter.

Figure 6:
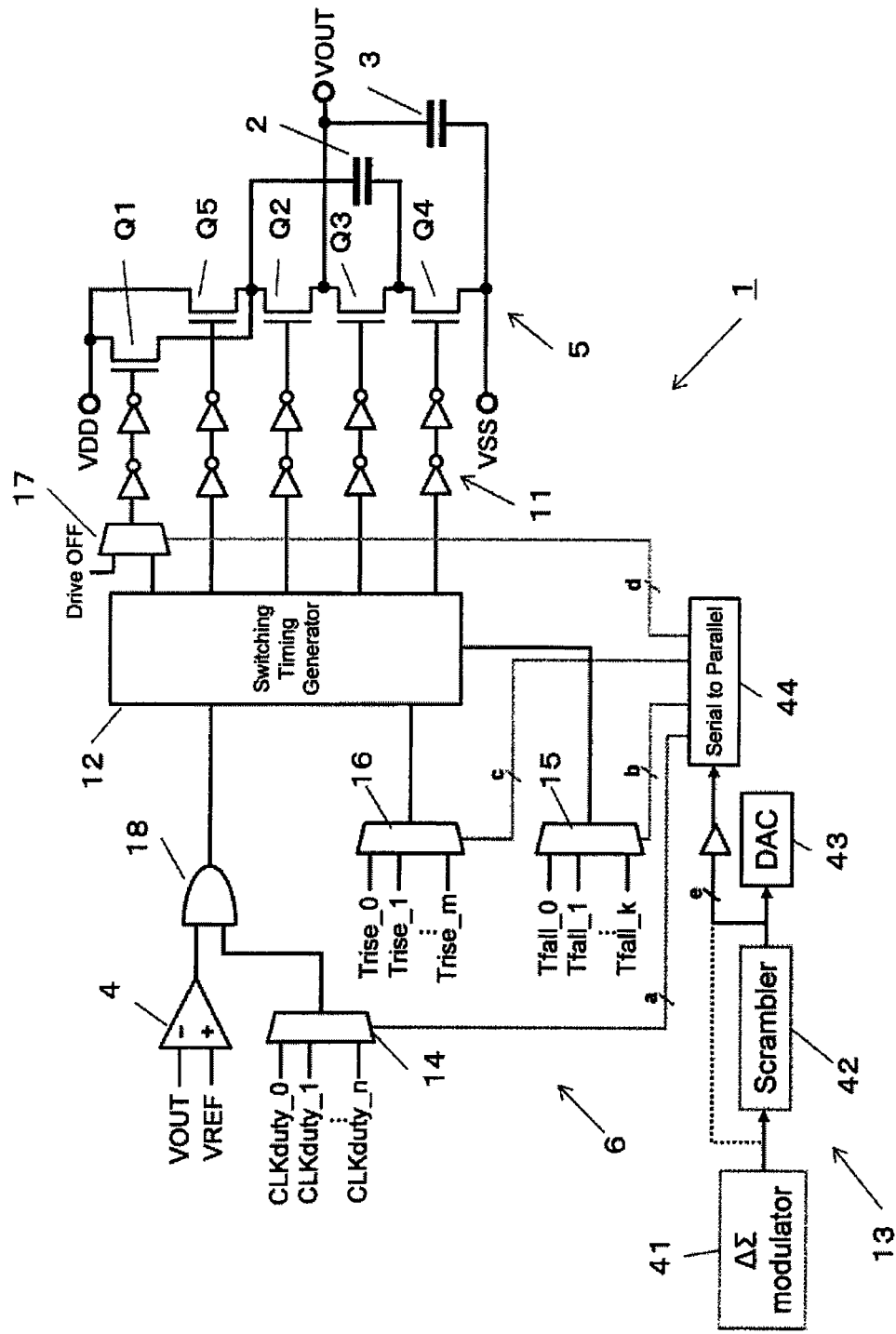
FIG. 6 is a block diagram showing a schematic configuration of a DC-DC converter according to a fourth embodiment.

FIG. 6 is a block diagram showing a schematic configuration of a DC-DC converter 1 according to a fourth embodiment. In FIG. 6, the same reference numbers and signs are marked to the components also found in FIG. 3. The following description is focused on the differences.

The internal configuration of the selection pattern generator 13 in the DC-DC converter 1 of FIG. 6 is different from FIG. 3. The selection pattern generator in FIG. 6 is equipped with a $\Delta\Sigma$ modulator 41, a scrambler 42, a D/A converter (DAC) 43, and a serial-parallel converter 44.

The output of $\Delta\Sigma$ modulator 41 is a single bit or a multi-bit signal that is highly randomized. The output of the D/A converter 43 is connected to the output amplifier as described later.

The serial-parallel converter 44 converts the bit string of the signal bit string outputted by the scrambler 42. Since the output signal of the serial-parallel converter 44 is highly randomized, the output signal provides the first through fourth bit strings a-d which are used for selection of the first through fourth multiplexers 14-17.

Figure 7:
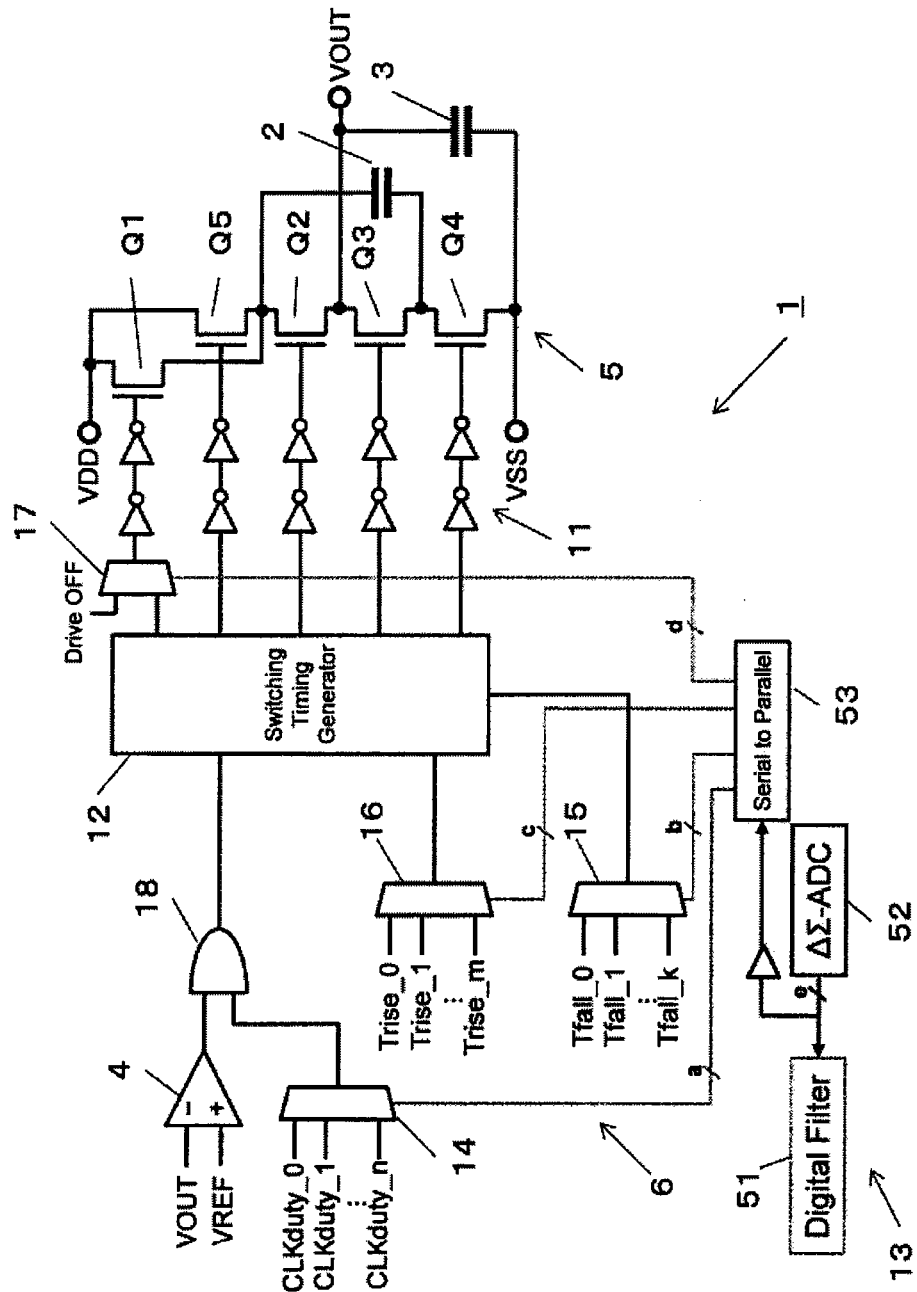
FIG. 7 is a block diagram showing a schematic configuration of a DC-DC converter according to a modified example of FIG. 6.

FIG. 7 is a block diagram showing a schematic configuration of a DC-DC converter 1 according to a modified example of FIG. 6. FIG. 7 includes a selection pattern generator 13 which is different from the configuration in FIG. 6. The selection pattern generator 13 of FIG. 7 includes a digital filter 51, a $\Delta\Sigma$ A/D converter 52, and a serial-parallel converter 53.

The highly randomized output signal of a single bit or multi-bit output from $\Delta\Sigma$ A/D converter 52 is input to serial-parallel converter 53, converted to bit strings which are then used to provide the previously mentioned first through fourth bit strings a-d.

Figure 8:
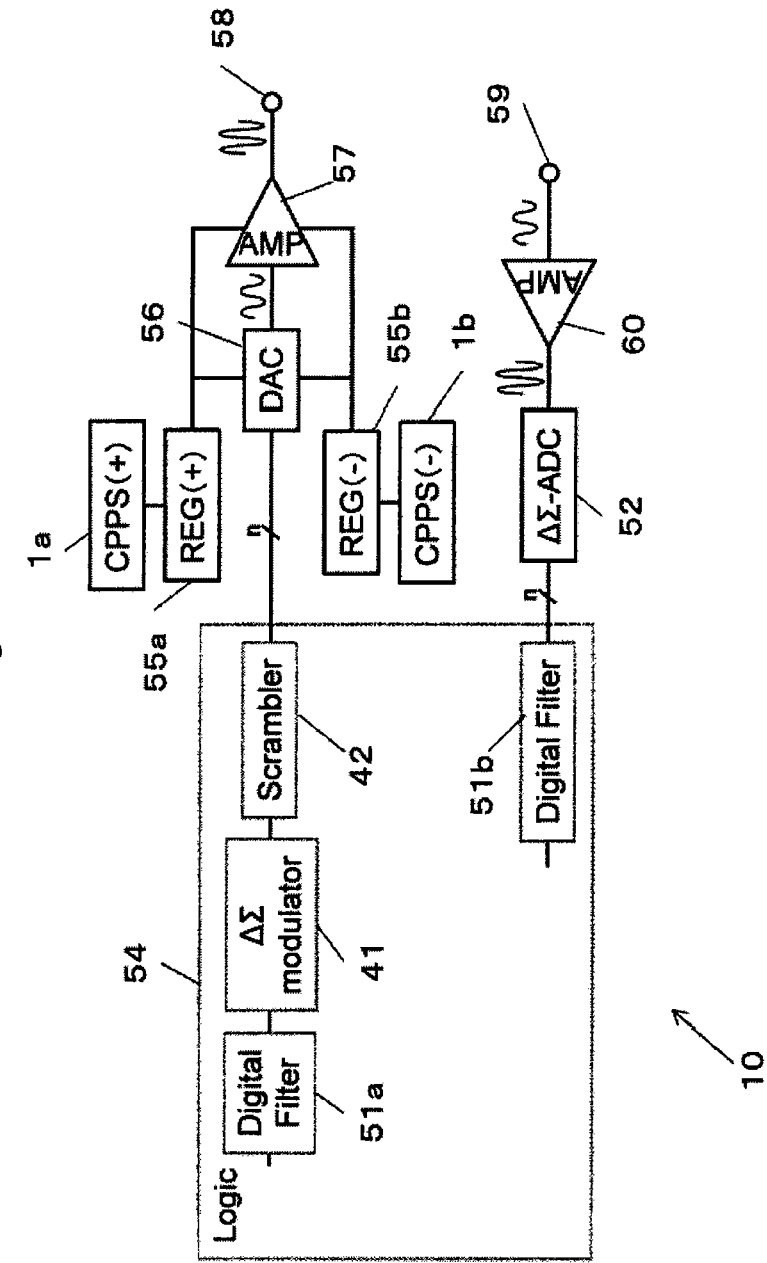
FIG. 8 is a block diagram showing a schematic configuration of a voice output device with an integrated DC-DC converter which is configured with the combination of FIGS. 6 and 7.

FIG. 8 is a block diagram showing a schematic configuration of a voice output device with an integrated DC-DC converter 1 which is configured using a combination of FIGS. 6 and 7. The audio output device 10 in FIG. 8 includes a logic section 54 built-in with a $\Delta\Sigma$ modulator 41, a scrambler 42, digital filters 51a and 51b, DC-DC converters 1a and 1b on the positive and negative sides, regulators 55a and 55b connected with these DC-DC converters 1a and 1b, a digital analog converter 56, an output amplifier 57 that enables variable output amplitude, a headphone terminal 58, a microphone input terminal 59, an input amplifier 60, and a $\Delta\Sigma$ A/D converter 52. At this time, it can be used not only for headphones, but also for LINE terminals and for the earphone speaker of mobile phones.

The DC-DC converter 1a on the positive side of FIG. 8 is configured identically to the converter FIG. 3. The DC-DC converter 1b is identical to the converter of FIG. 13, which will be described later. The switch timing generator 12 contained inside the DC-DC converters 1a and 1b generates the randomized output signal by using the output of ΔΣ modulator 41 or ΔΣ A/D converter 52 of FIG. 8.

In this manner, the internal configuration of the selection pattern generator 13 in the DC-DC converters 1a, 1b can be simplified to generate the random signal by using the output signal of ΔΣ modulator 41 or ΔΣ A/D converter 52 that was depicted as being installed in the audio output device 10 in the fourth embodiment.

Embodiment 5

Figure 9:
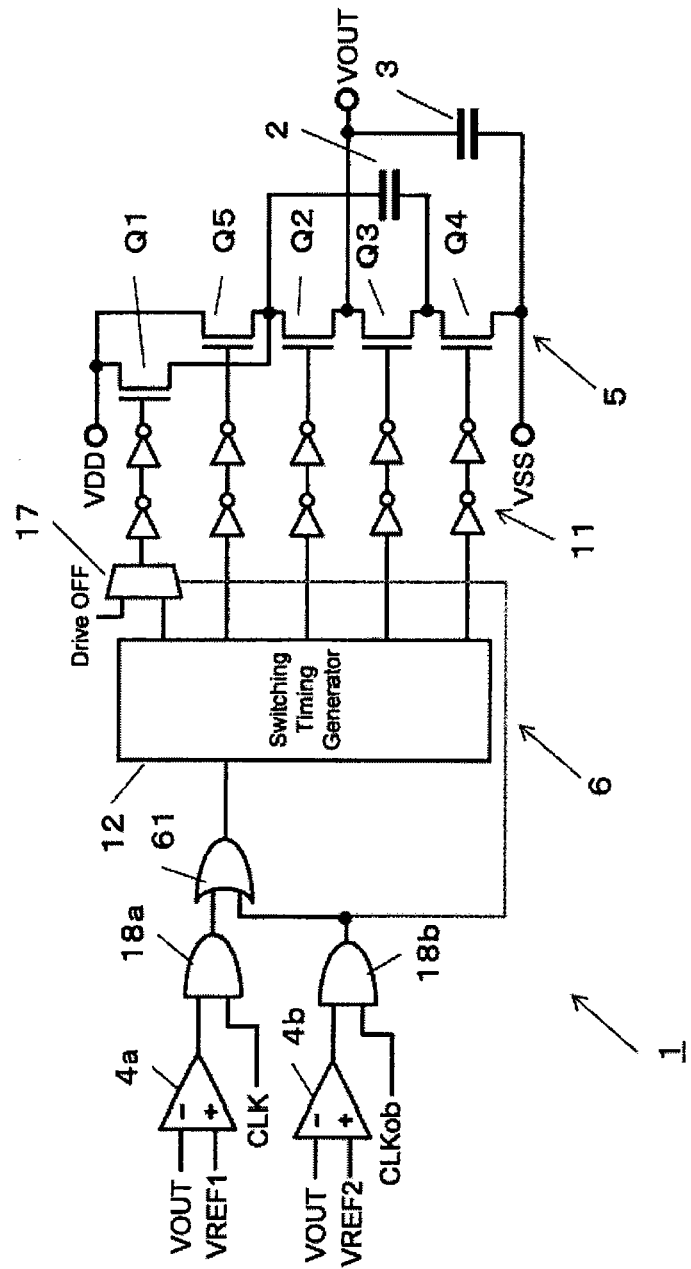
FIG. 9 is a block diagram showing a schematic configuration of a DC-DC converter according to a fifth embodiment.

The fifth embodiment described in the following shifts the spurious element to a low frequency part of the spectrum. FIG. 9 is a block diagram showing a schematic configuration of a DC-DC converter 1 according to the fifth embodiment. In FIG. 9, the same reference letters with FIG. 3 are marked to the common components, and the differences are described in the following.

As for the DC-DC converter 1 in FIG. 9, the configuration of the input side of the switch timing generator 12 is different from FIG. 3. DC-DC converter 1 in FIG. 9 includes a first comparator 4a that compares the output voltage VOUT with the first reference voltage VREF1; a second comparator 4b that compares output voltage VOUT with the second reference voltage VREF2; a first AND circuit 18a that outputs an inputted first clock signal CLK only when the output signal of the first comparator 4a is high; a second AND circuit 18b that outputs an inputted second clock signal CLKob only when the output signal of the second comparator 4b is high; and an OR circuit 61 that generates a logical sum signal based on logically summing an output signal of the first AND circuit 18a and an output signal of the second AND circuit 18b. The output signal from the OR circuit 61 is inputted to the switch timing generator 12.

The second clock signal CLKob is a clock signal having a frequency outside the audible bandwidth, and it is higher than the frequency of the first clock signal CLK. The second reference signal VREF2 has a higher voltage than the first reference signal VREF1.

When output voltage VOUT is lower than the first reference signal VREF1, the output voltage VOUT is pulled up by synchronizing the timing with the first clock signal CLK, and when output voltage VOUT is lower than the second reference signal VREF2, the output voltage VOUT is pulled up by synchronizing the timing with the second clock signal CLKob that has a faster clock cycle than the first clock signal CLK.

At this time, only Q1 among the transistors Q1 and Q5 is turned on when the output voltage VOUT is pulled up by synchronizing the timing with the second clock signal CLKob. The amount of voltage pulled up when the timing is synchronized with the second clock signal CLKob is smaller than the amount of voltage pulled up when the timing is synchronized with the first clock signal CLK.

This output operation that is synchronized with the first clock signal CLK is an operation similar to the 1st through the 4th embodiments. The characteristics of this embodiment are that the operation of the higher clock cycle output of the pulled-up voltage that is synchronized with the second clock signal CLKob is performed between the intervals of the output of the pulled-up voltage that is synchronized with the first clock.

FIGS. 10A and 10B are figures showing the characteristics of DC-DC converter 1 in FIG. 9. FIG. 10A is a waveform chart of the output voltage of DC-DC converter 1 in FIG. 9. As shown in this figure, DC-DC converter 1, according to this embodiment, executes a first operation of the output voltage synchronized with the first clock signal CLK to allow the output voltage VOUT to periodically increase at a bigger rate with the first comparator 4a, and executes a second operation of the output voltage synchronized with the second clock signal CLKob to allow the output voltage VOUT to increase slightly at a cycle faster than the first operation with the second comparator 4b. Therefore, the output voltage waveform will be like the saw-tooth waveform in which fine saw-tooth waves are arranged between big saw-tooth waves as shown in FIG. 10A.

The cycle of the fine saw-tooth waveform in FIG. 10A depends on the second clock signal CLKob which has higher frequency than the audible bandwidth. Therefore, the frequency spectrum after FFT of the output voltage waveform in FIG. 10A reveals two spurious frequency components, which can be seen in FIG. 10B. One spurious component exists in the audible bandwidth, due to the first operation. This spurious component reduces to a level that is below the audibility level, and therefore, is not outputted as noise in the audible region.

Another spurious output component is caused by the second operation, which appears outside of the audible bandwidth. Although the amplitude of this second spurious component is large, since it is outside the audible bandwidth, it still would not be output as detectable noise in the audible region.

Thus, in the fifth embodiment, in the intervals of the first operations which produce the output voltage VOUT by comparing the output voltage VOUT of the DC-DC converter 1 with the first reference voltage VREF1, the second operations, cycled faster than the first operations, are executed to produce the output voltage VOUT by periodically comparing the output voltage VOUT with the second reference voltage VREF2. Since boosting of the output voltage is performed frequently by the second operation, the cycle for execution of the first operation can be prolonged compared to the 1st through 4th embodiments, and the spurious element can be shifted to the low frequency zone. Since the attenuation of the weighted filter (not shown in the figure) in the low frequency zone is great, the spurious element can be held below the audibility level.

Moreover, since the second operation is performed by synchronizing with the second clock signal CLKob, which is outside the audible bandwidth, the spurious element present in the output voltage by the second operation will be outside the audible bandwidth, and the undesirable noise will not be audible.

Other Embodiments

The examples in the 1st through 4th embodiments describe the case of using the charge pump type of DC-DC converter 1, and generating the output voltage VOUT in which the power source voltage is decreased. It is also applicable to the DC-DC converter 1 that generates the output voltage VOUT in which the power-supply voltage is boosted as an alternate embodiment.

Figure 11:
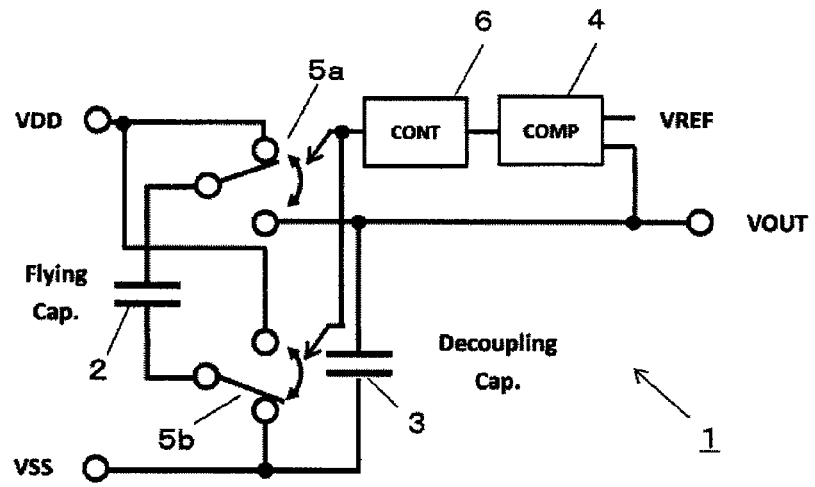
FIG. 11 is a block diagram showing a schematic configuration of a DC-DC converter for boosting the power supply voltage.

FIG. 11 is a block diagram showing a schematic configuration of a DC-DC converter 1 for boosting the power supply voltage. The switcher 5 of DC-DC converter 1 in FIG. 11 includes the interlocked 1st and 2nd switches 5a and 5b. The first switch 5a connects one terminal of the flying capacitor 2 with the power supply terminal VDD in the first switching state, and connects to the output terminal VOUT in the second switching state. The second switch 5b connects the other terminal of the flying capacitor 2 with the ground terminal VSS in the first switching state, and connects it with the power supply terminal VDD in the second switching state.

FIG. 11 shows the example that the first switch 5a is in the first switching state. At this time, the potential for the electrode at the upper side of the flying capacitor 2 shown in the diagram becomes VDD, and the electrical potential for a lower electrode becomes 0V. When the first switch 5a switches to the second switching state, the potential of the lower electrode of the flying capacitor 2 becomes VDD. The electrical potential of the upper electrode of the flying capacitor becomes VDD+VDD=2 VDD, and this voltage is output as the output voltage VDD, according to the law of conservation of charge. As a result, the output voltage VOUT becomes a voltage that is higher than the power-supply voltage VDD.

Figure 12:
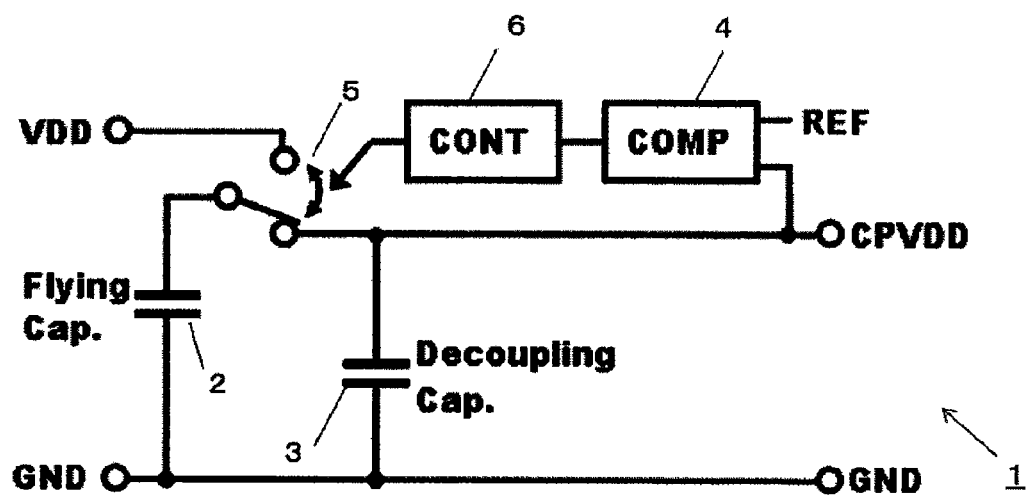
FIG. 12 is a diagram showing the schematic configuration of a step-down type of DC-DC converter that can output the output voltage VOUT having a voltage level equivalent to the power supply voltage VDD.

As an alternative embodiment in FIG. 1, the second switch 5b in FIG. 1 is deleted, and the flying capacitor is always connected to VSS. As shown in FIG. 12, the stepping down type of DC-DC converter 1 can be configured so that the output voltage VOUT at the equivalent voltage level with the power source voltage VDD is enabled for output. The first switch 5 in the DC-DC converter 1 of FIG. 12 connects the output terminal VOUT with one terminal of the flying capacitor 2 in the first switching state, and connects the power supply terminal VDD in the second switching state.

Figure 13:
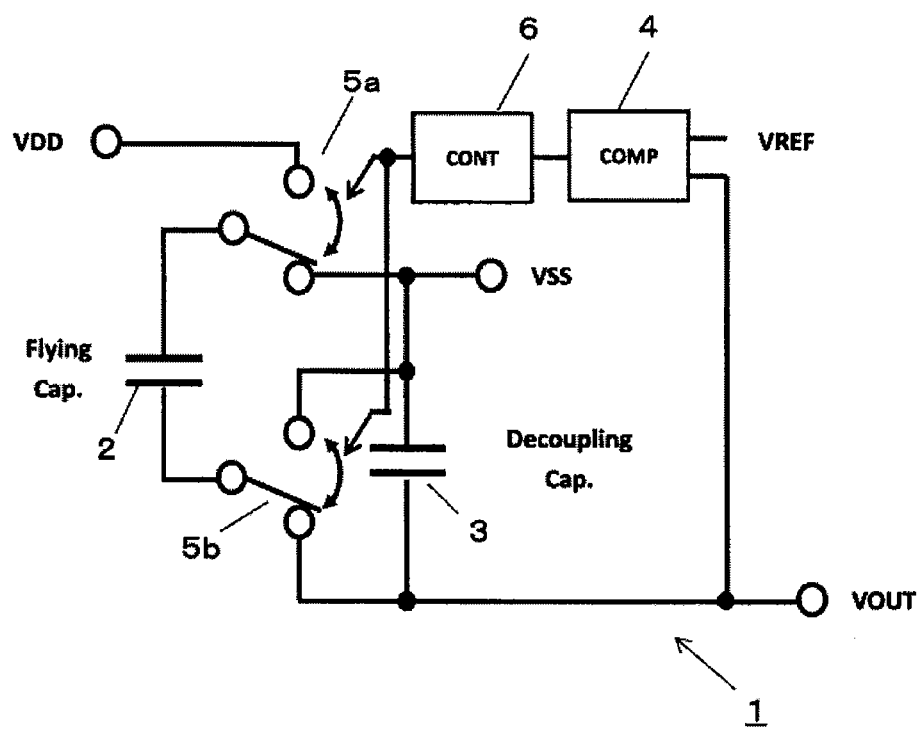
FIG. 13 is a diagram showing the schematic configuration of a DC-DC converter for generating a negative voltage level of output voltage VOUT.

Moreover, as shown in FIG. 13, this is also applicable to the DC-DC converter 1 that generates output voltage VOUT at the negative voltage level as another alternative embodiment. The first switch 5a of the DC-DC converter 1 in FIG. 13 connects the ground terminal VSS with one terminal of the flying capacitor 2 when the switch is in the first switching state, and connects the power supply terminal VDD with the other terminal of the flying capacitor 2 when the switch is in the second switching state. The second switch 5b connects the output terminal VOUT with the other terminal of the flying capacitor 2 in the first switching state, and connects the ground terminal VSS in the second switching state.

Thus, the DC-DC converter 1 of the first through fifth embodiments is applicable also to the case of the generation of the output voltage VOUT in which the power source voltage VDD is boosted. It is also applicable when the generation of the output voltage VOUT includes negative voltage, in addition to the case of generating the output voltage VOUT in which the power source voltage VDD is decreased.

For instance, the DC-DC converter 1 according to the first through fifth embodiments is used for the power supply circuit of an audio output unit. The audio output unit has an output amplifier 57 as shown in FIG. 8, and the output voltage of the DC-DC converter 1 can be supplied to the power supply terminal of this output amplifier 57.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A DC-DC converter comprising:
a first capacitor configured to be charged by a power-supply voltage,
a second capacitor configured to provide an output voltage, the output voltage being caused by electric charge previously discharged by the first capacitor;
a comparator configured to compare the output voltage with a first reference voltage, and to output a first comparison signal indicative of whether the output voltage is greater or less than the first reference voltage;
a switch configured to allow the first capacitor to be charged, and also configured to allow the first capacitor to discharge to the second capacitor; and
a controller configured to control switch timing of the switch, the controlling being based on the first comparison signal;
the controller further being configured to randomize the times of a cycle at which the first capacitor is charged;
wherein the controller comprises a duty selector configured to randomly select a clock signal from amongst multiple clock signals of a same frequency, the multiple clock signals being of different duty ratios;
wherein the switch is further configured to switch based on the clock signal randomly selected by the duty selector; and
wherein the duty selector is further configured to randomly select a clock signal by sending a first random bit stream to a first multiplexer associated with clock signals having different duty ratios.

2. The DC-DC converter of claim 1, wherein the first random bit stream is generated by a random number generator.

3. The DC-DC converter of claim 1, wherein
the controller further comprises a rise time selector configured to randomly select a rise time of the clock signal randomly selected by the duty selector.

4. The DC-DC converter of claim 3, wherein the rise time selector is further configured to randomly select a clock signal by sending a second random bit stream to a second multiplexer associated with clock signals having different rise times.

5. The DC-DC converter of claim 3, wherein
the controller further comprises a fall time selector configured to randomly select a fall time of the clock signal randomly selected by the duty selector.

6. The DC-DC converter of claim 5, wherein the fall time selector is further configured to randomly select a fall time by sending a third random bit stream to a third multiplexer associated with clock signals having different rise times ratios.

7. The DC-DC converter of claim 1, wherein
the controller is further configured to control the switch timing of the switch based on an output signal of a $\Delta\Sigma$ modulator of an $\Delta\Sigma$ D/A converter or the output signal of an $\Delta\Sigma$ A/D converter.

8. A DC-DC converter comprising:
a first capacitor configured to be charged by a power-supply voltage,
a second capacitor configured to provide an output voltage, the output voltage being caused by electric charge previously discharged by the first capacitor;
a comparator configured to compare the output voltage with a first reference voltage, and to output a first comparison signal indicative of whether the output voltage is greater or less than the first reference voltage;
a switch configured to allow the first capacitor to be charged, and also configured to allow the first capacitor to discharge to the second capacitor; and a controller configured to control switch timing of the switch, the controlling being based on the first comparison signal;

the controller further being configured to randomize the times of a cycle at which the first capacitor is charged;

wherein the switch comprises multiple MOS transistors configured to be individually switched on and off;

wherein the controller randomly controls timing for turning each of the multiple MOS transistors on and off, and controls an ON resistance of at least one of the multiple MOS transistors; and wherein the multiple MOS transistors are part of a group of five transistors connected between the source voltage and ground, and wherein two of the five transistors are connected in parallel.

9. The DC-DC converter of claim 8, wherein the controller controls the ON resistance by turning on the two parallel transistors in tandem.

10. The DC-DC converter of claim 9, wherein when the first capacitor is being charged, the two parallel transistors are on, and when the capacitor is being discharged, the two parallel transistors are off.

11. The DC-DC converter of claim 10, wherein
the controller is further configured to control the switch timing of the switch so as to randomize, for each cycle, a length of time when both the first capacitor and the second capacitor are not being charged.

12. The DC-DC converter of claim 11, wherein randomizing the length of time when both the first capacitor and the second capacitor are not being charged reduces the amplitude of noise ripples in the output voltage or randomizes a time at which noise ripples in the output voltage occur.

13. The DC-DC converter of claim 8, wherein
the controller is further configured to control the switch timing of the switch based on an output signal of a $\Delta\Sigma$ modulator of an $\Delta\Sigma$ D/A converter or the output signal of an $\Delta\Sigma$ A/D converter.

14. A DC-DC converter comprising:
a first capacitor configured to be charged by a power-supply voltage,
a second capacitor configured to provide an output voltage, the output voltage being caused by electric charge previously discharged by the first capacitor;

a comparator configured to compare the output voltage with a first reference voltage, and to output a first comparison signal indicative of whether the output voltage is greater or less than the first reference voltage;

a switch configured to allow the first capacitor to be charged, and also configured to allow the first capacitor to discharge to the second capacitor; and a controller configured to control switch timing of the switch, the controlling being based on the first comparison signal;

the controller being further configured to randomize the times of a cycle at which the first capacitor is charged; and a second comparator configured to compare the output voltage with a second reference voltage which is higher than the first reference voltage, and configured to output a second comparison signal, the second comparison signal indicative of whether the output voltage is less than the second reference voltage;

wherein, the controller is further configured to control the switch timing of the switch during a first cycle on the basis of the first comparison signal, and during a second cycle on the basis of the second comparison signal, the second cycle being shorter than the first cycle.

15. The DC-DC converter of claim 14, further comprising:
a first AND circuit configured to have a first clock signal and the first comparison signal as an input;
a second AND circuit configured to have a second clock signal and the second comparison signal as an input;
an OR circuit that generates a logical sum signal based on logically summing an output signal of the first AND circuit and an output signal of the second AND circuit.

16. The DC-DC converter of claim 15, wherein the second clock signal has a frequency outside the audible bandwidth and which is higher than the frequency of the first clock signal.

17. The DC-DC converter of claim 14, wherein
the controller is further configured to control the switch timing of the switch based on an output signal of a $\Delta\Sigma$ modulator of an $\Delta\Sigma$ D/A converter or the output signal of an $\Delta\Sigma$ A/D converter.

* * * * *